United States Patent
Aslanzadeh

(10) Patent No.: US 8,149,031 B1
(45) Date of Patent: Apr. 3, 2012

(54) DUTY-CYCLE FEEDBACK CHARGE PUMP

(75) Inventor: Hesam Amir Aslanzadeh, San Jose, CA (US)

(73) Assignee: Applied Micro Circuits Corporation, San Diego, CA (US)

(*) Notice: Subject to any disclaimer, the term of this patent is extended or adjusted under 35 U.S.C. 154(b) by 0 days.

(21) Appl. No.: 12/877,126

(22) Filed: Sep. 8, 2010

(51) Int. Cl.
*H03L 7/06* (2006.01)

(52) U.S. Cl. ......... 327/157; 327/156; 327/147; 327/148

(58) Field of Classification Search ................ 327/156, 327/157, 147, 148
See application file for complete search history.

(56) References Cited

U.S. PATENT DOCUMENTS

| | | | |
|---|---|---|---|
| 5,508,660 A * | 4/1996 | Gersbach et al. | 331/17 |
| 5,760,640 A * | 6/1998 | Girard et al. | 327/543 |
| 5,801,578 A | 9/1998 | Bereza | |
| 6,326,852 B1 * | 12/2001 | Wakayama | 331/17 |
| 7,012,473 B1 * | 3/2006 | Kokolakis | 331/17 |
| 7,015,736 B1 | 3/2006 | Sudjian et al. | |
| 7,199,630 B2 * | 4/2007 | Kim | 327/158 |
| 7,242,255 B1 * | 7/2007 | Chen et al. | 331/16 |
| 7,385,429 B1 * | 6/2008 | Mei et al. | 327/157 |
| 2004/0004500 A1 * | 1/2004 | Byun et al. | 327/156 |

* cited by examiner

*Primary Examiner* — Ryan Jager
(74) *Attorney, Agent, or Firm* — Law Office of Gerald Maliszewski; Gerald Maliszewski

(57) ABSTRACT

A charge pump includes a reference charge pump with an input interface to accept a phase detector signal and a duty-cycle feedback signal, and an output to supply a control voltage. A replica charge pump accepts the phase detector signal supplies the duty-cycle feedback signal. If the reference charge pump source current (Ip) becomes mismatched with the sinking current (In), non-equal Tn and Tp time periods may result. The phase detector accepts reference and data signals having a steady state offset error and supplies a non-50% duty cycle square wave phase detector signal. The replica charge pump supplies a duty-cycle feedback signal to the reference charge pump responsive to the non-50% duty cycle phase detector signal and the reference charge pump equalizes the source and sink currents. When the phase detector measures reference and data signals fully orthogonal in phase, it supplies s 50% duty cycle signal.

7 Claims, 10 Drawing Sheets

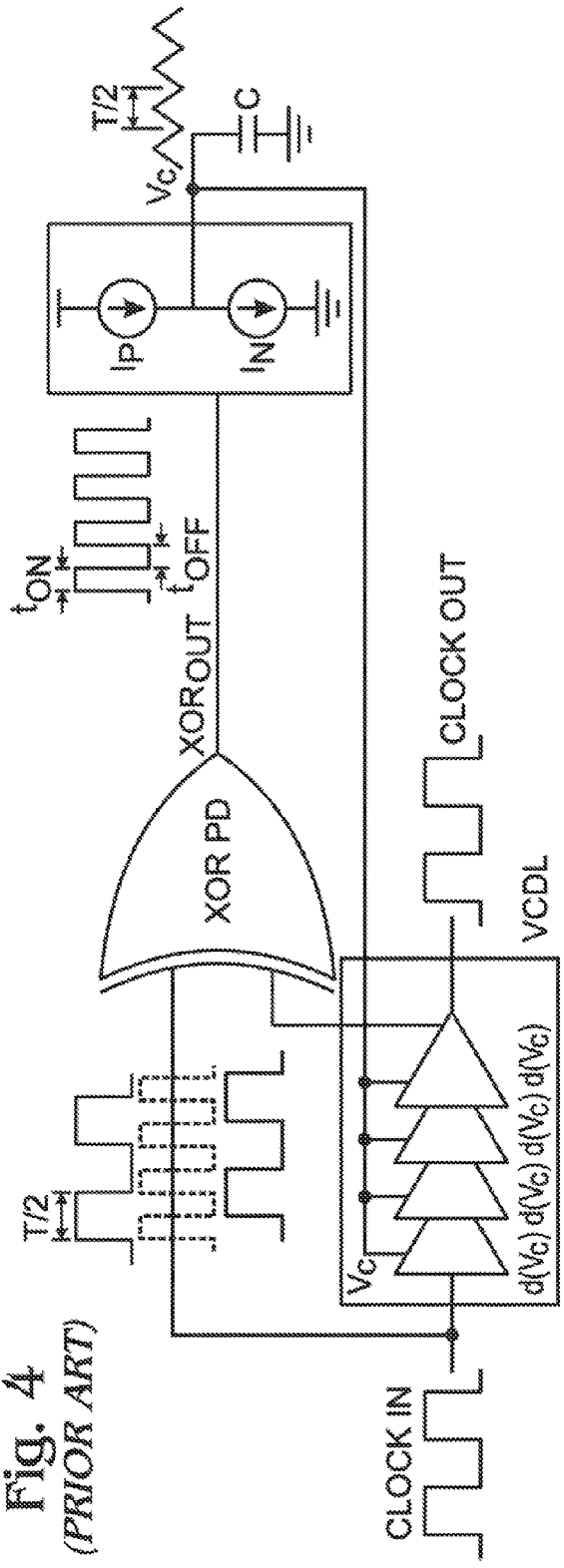
Fig. 4 *(PRIOR ART)*
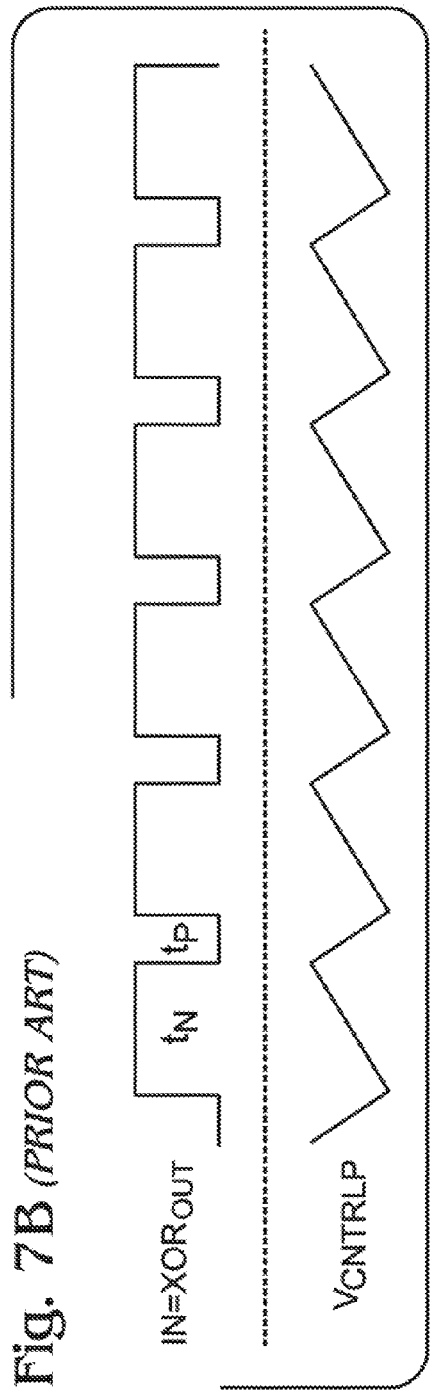
Fig. 7B *(PRIOR ART)*

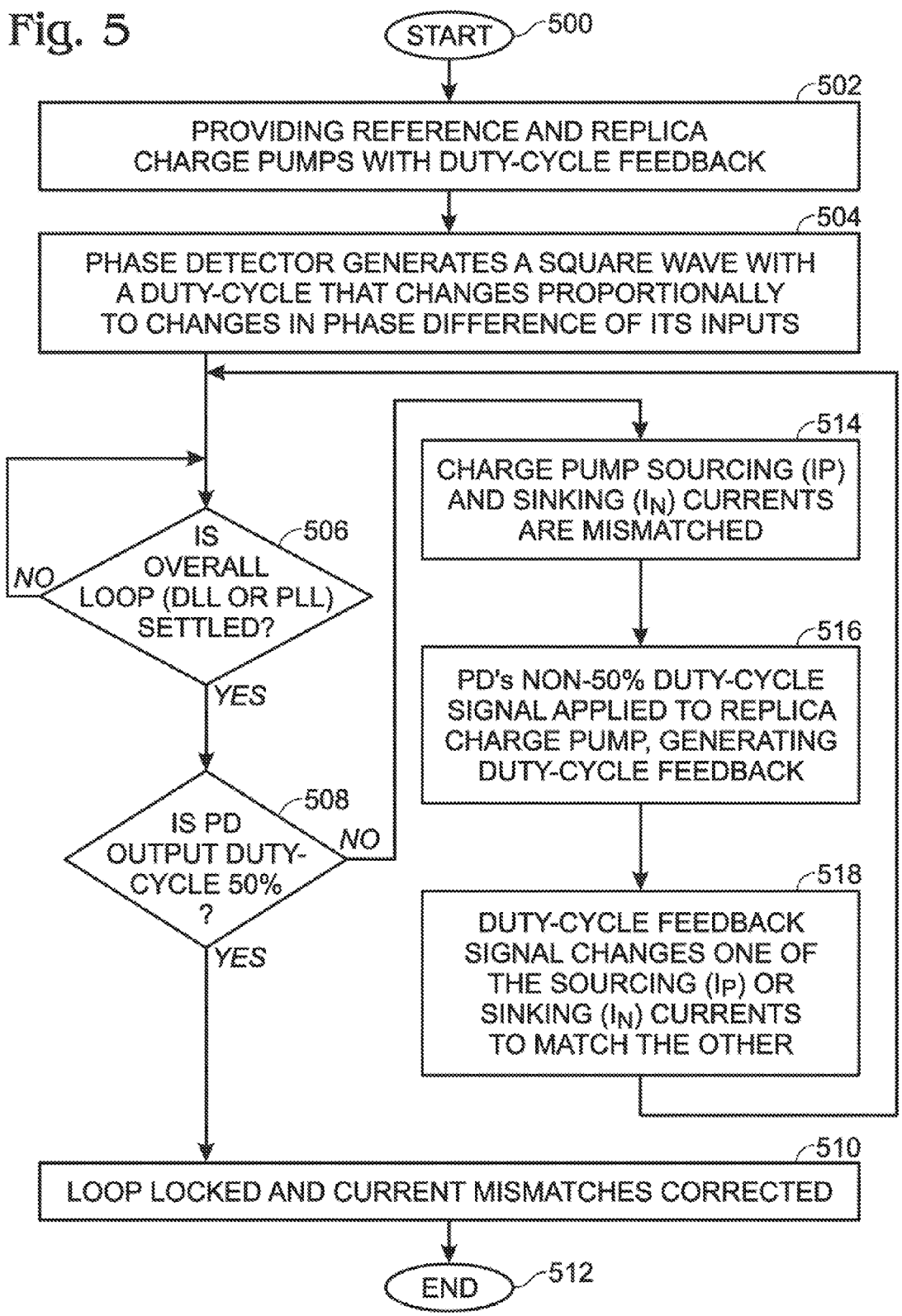

DUTY-CYCLE FEEDBACK CHARGE PUMP

BACKGROUND OF THE INVENTION

1. Field of the Invention

This invention generally relates to phase locked-loops and, more particularly, to a duty-cycle feedback charge pump suitable for use in delay locked-loops (DLLs) and phase locked-loops (PLLs).

2. Description of the Related Art

A charge pumps is often interposed between the phase detector and voltage controlled oscillator (VCO) of a PLL to condition the VCO control voltage. In a PLL the phase difference between the reference signal and the output signal is translated into two opposite voltage polarities, or in the case of differential signals—UP and DN. The two signals control switches to steer current into or out of a capacitor, causing the voltage across the capacitor to increase or decrease. In each cycle, the time during which the switch is turned on is proportional to the phase difference. Hence, the charge delivered is dependent on the phase difference. The voltage on the capacitor is used to tune the VCO, generating the desired output signal frequency.

FIG. 2 is a schematic diagram of a charge pump, as presented by Gersbach et al., U.S. Pat. No. 5,508,660, entitled, Charge pump circuit with symmetrical current output for phase-controlled loop system (prior art). The depicted design is not a low-voltage solution, and the use of a voltage signal as feedback imposes supply limitations, resulting is a complex, high-cost design. For example, separate up/down signals are required, so a differential output phase detector is needed. Further, the design has stability challenges, and only capable of Class B operation in a feedback loop.

Bereza et al., in U.S. Pat. No. 5,801,578, entitled, Charge pump circuit with source-sink current steering present a design that is not a low-voltage solution, and the use of voltage signal as feedback imposes supply limitations. The open-loop control of current-matching is not robust, and there is a need for separate up/down signals, requiring a more complex phase detector.

FIG. 3 is a schematic diagram of a charge pump as presented by Sudjian et al., U.S. Pat. No. 7,015,736, entitled, Symmetric Charge pump (prior art). Again, the design is not a low-voltage solution. The use of a voltage signal as feedback imposes supply design limitations. There is need for a differential output phase detector, and the open-loop control of current matching is not robust.

FIG. 4 is a schematic diagram of the DLL of FIG. 1, showing the charge pump in greater detail. After each half-period:

$$V_{C(new)} = V_{C(old)} - \frac{t_{ON} I_N}{C} + \frac{t_{OFF} I_P}{C} =$$
$$V_{C(old)} - \frac{t_{ON} I_N}{C} + \frac{(T/2 - t_{ON}) I_P}{C} t_{ON} = 4\ Tdelay(V_C)$$

After the DLL loop is settled:

$$V_{C(new)} = V_{C(old)} - \frac{t_{ON} I_N}{C} + \frac{(T/2 - t_{ON}) I_P}{C}.$$

$$\begin{cases} t_{ON} = (T/2) \frac{I_P}{I_N + I_P} \\ t_{OFF} = (T/2) \frac{I_N}{I_N + I_P} \end{cases} \text{and}$$

To have the signals at the input of the XOR (PD) orthogonal (90° out of phase), and hence accurately settling on the desired delay, tON should be equal to tOFF, assuming that clock has a 50% duty-cycle.

$$I_P = I_N$$

For best delay accuracy Ip should be kept equal to In in all process/voltage/temperature (PVT) corners, which is especially challenging when using supply voltages as low as 0.67 V. Complex phase detectors and charge pumps have been used to address this problem.

FIG. 6 is a schematic diagram of a charge pump with no current matching (prior art). Advantageously, the design is simple and self-biased. However, the design is dependent upon the supply voltages, and mismatches between the PMOS and NMOS transistors result in delay offsets after the loop has locked and is settled. It is difficult to precisely match the Ip and In currents, especially at low supply voltages.

FIGS. 7A and 7B are schematic and signal graphs, respectively, of a charge pump with open-loop current matching (prior art). Advantageously, the design is simple, self-biased, and has better current matching than the design of FIG. 6. However, the matching is coarse. Mismatch between PMOS and NMOS current occur due to different drain-source voltages (VDS) and regions of operation. As seen in FIG. 7B, an unbalanced (non-50%) duty cycle at the input of the charge pump causes steady state errors in the overall loop.

The design is also very dependent on V(OUT), which has a wide range of variation. Further, mismatch in PMOS and NMOS current results in delay offsets after locking and settling, and as mentioned above, it is difficult to match Ip to In at low voltages.

It would be advantageous if a charge pump design could effectively match Ip to In currents when using relatively low control voltages.

SUMMARY OF THE INVENTION

Disclosed herein is a charge pump design that uses the "duty-cycle" of a phase detector, as opposed to voltage, as a feedback signal to monitor the important property of current-matching between source, and sink currents of the charge pump in a locked-loop system, and provides correction, as current-matching in a locked-loop directly affects steady-state errors after loop settling. Because the charge pump uses closed-loop feedback to correct current matching in real-time, and also uses duty-cycle as the feedback signal, it can operate in very low voltages, making the design very robust and practical in all process/voltage/temperature (PVT) variations and a good candidate for deep submicron technologies.

The charge pump can be used in delay locked-loop (DLL) and phase locked-loop (PLL) systems. The closed-loop feedback monitoring of the duty-cycle at the output of the phase detector (PD) to match sourcing and sinking currents in the charge pump which results in lower overall delay offset and lower delay offset variation.

Accordingly, a method is provided for balancing current mismatches in a locked loop charge pump. A phase detector accepts a data signal having a first frequency and a reference clock having the first frequency, and to supplies a phase detector signal. A charge pump includes a reference charge pump having an input interface to accept the phase detector signal and a duty-cycle feedback signal. The reference charge pump supplies a control voltage. A replica charge pump accepts the phase detector signal and supplies the duty-cycle feedback signal. A loop filter accepts the control voltage and supplies a conditioned control voltage. A voltage controlled phase operator has an input to accept the conditioned control voltage and an output to supply a voltage controlled phase operator output signal. In response to a phase of the data signal being orthogonal to a phase of the reference clock, the phase detector supplies a square wave phase detector signal having a 50% duty cycle. The charge pump sinks a first amount of charge during a first 50% portion of each control voltage duty cycle, equal to the first amount of charge sourced during a second 50% portion of each control voltage duty cycle.

In one aspect, the reference charge pump includes a first p-channel metal-oxide semiconductor (PMOS) to accept the phase detector signal, a second PMOS to accept the duty-cycle feedback signal and supply the control voltage source current, a first n-channel MOS (NMOS) to supply the control voltage sink source, a second NMOS, and a first capacitor having a first terminal connected to the control voltage. The replica charge pump includes an inverter having an input to accept the phase detector signal, and an output to supply an inverted phase detector signal, a third PMOS to accept the inverted phase detector signal, a fourth PMOS to supply the duty-cycle feedback signal, a third NMOS to supply the duty-cycle feedback signal, a fourth NMOS to accept the inverted phase detector signal, and a second capacitor having a first terminal connected to the duty-cycle feedback signal. Then, sinking the first amount of charge equal to the sourced amount of charge includes:

$Ip \times Tp = In \times Tn$, where In is the reference charge pump sink current;
Ip is the reference charge pump source current;
Tp is the time period when the reference charge pump NMOSs are turned off; and,
Tn is the time period when the reference charge pump NMOSs are turned on.

If the reference charge pump source current (Ip) becomes mismatched with the sinking current (In), non-equal Tn and Tp time periods may result. In response to the mismatched currents, the phase detector accepts reference and data signals having a steady state offset error and supplies a non-50% duty cycle square wave phase detector signal. The replica charge pump supplies a duty-cycle feedback signal to the reference charge pump responsive to the non-50% duty cycle phase detector signal. The reference charge pump equalizes the source and sink currents in response to the duty-cycle feedback signal. The phase detector measures reference and data signals fully orthogonal in phase, and supplies the square wave phase detector signal with the 50% duty cycle.

Additional details of the above-described method, a duty-cycle feedback charge pump, and a locked loop using a duty-cycle feedback charge pump, are provided below.

BRIEF DESCRIPTION OF THE DRAWINGS

FIG. 4 is a schematic diagram of the DLL of FIG. 1, showing the charge pump in greater detail.

FIG. 5 is a flowchart illustrating a variation in the method for balancing current mismatches in a locked loop charge pump.

FIGS. 7A and 7B are a schematic and signal graph, respectively, of a charge pump with open-loop current matching (prior art).

DETAILED DESCRIPTION

Figure 8:
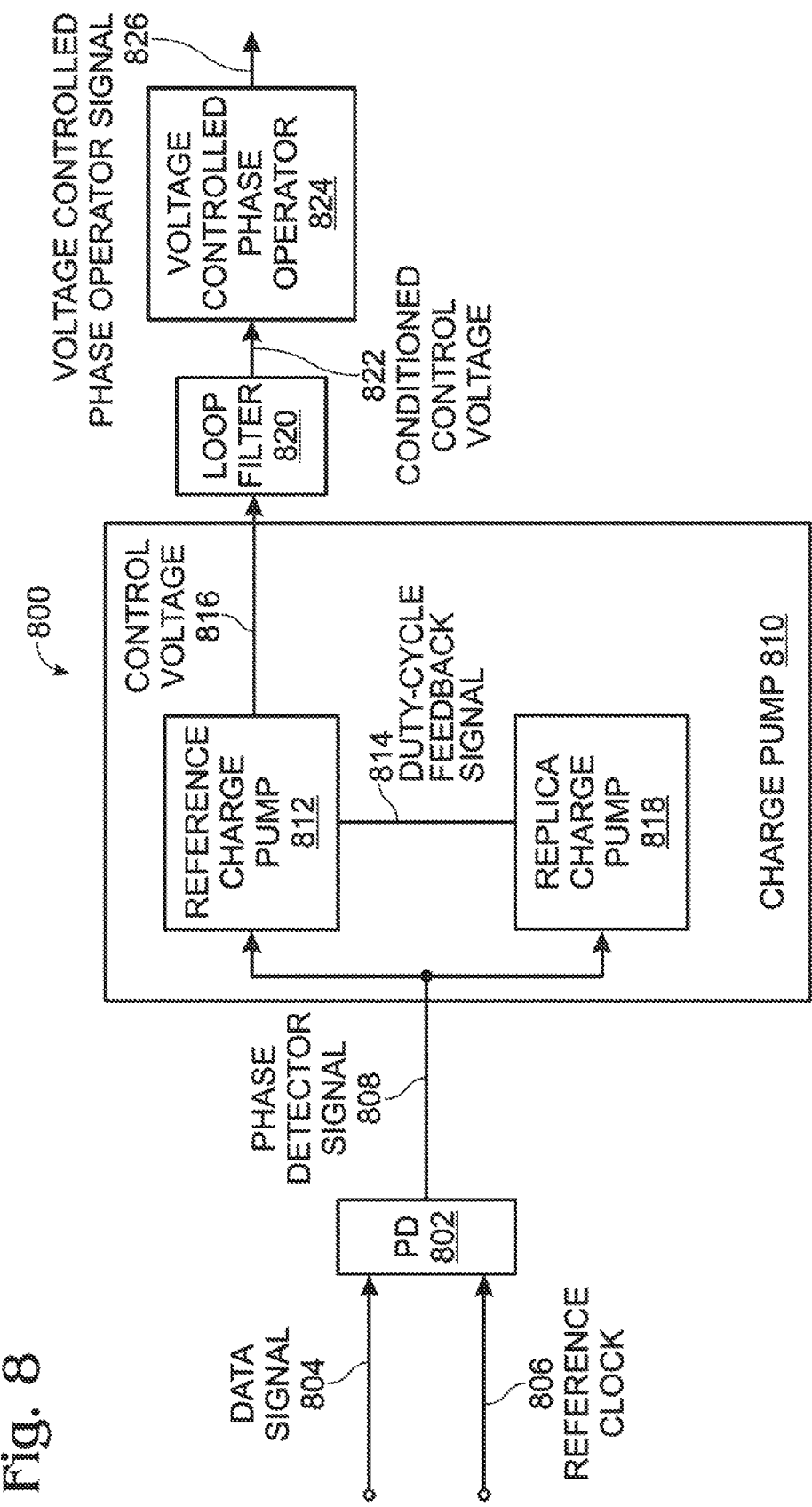
FIG. 8 is a schematic block diagram of a locked loop with a duty-cycle feedback charge pump.

FIG. 8 is a schematic block diagram of a locked loop with a duty-cycle feedback charge pump. The locked loop 800 comprises a phase detector (PD) 802 having a first input on line 804 to accept a data signal having a first frequency and a second input on line 806 to accept a reference clock having the first frequency. The PD 802 has an output on line 808 to supply a phase detector signal with a change in duty cycle proportional to a change in phase difference between the data signal and the reference clock.

A charge pump 810, which may also be referred to as a charge pump set, includes a reference charge pump 812 having an input interface on line 808 to accept the phase detector signal, an interface on line 814 to accept a duty-cycle feedback signal, and an interface on line 816 to supply a control voltage. A replica charge pump 818 has an interface on line 808 to accept the phase detector signal and an interface on line 814 to supply the duty-cycle feedback signal.

A loop filter 820 has an input on line 816 to accept the control voltage and an output on line 822 to supply a conditioned control voltage. A voltage controlled phase operator 824 has an input on line 822 to accept the conditioned control voltage and an output on line 826 to supply a voltage controlled phase operator signal with a phase responsive to the conditioned control voltage.

Figure 9:
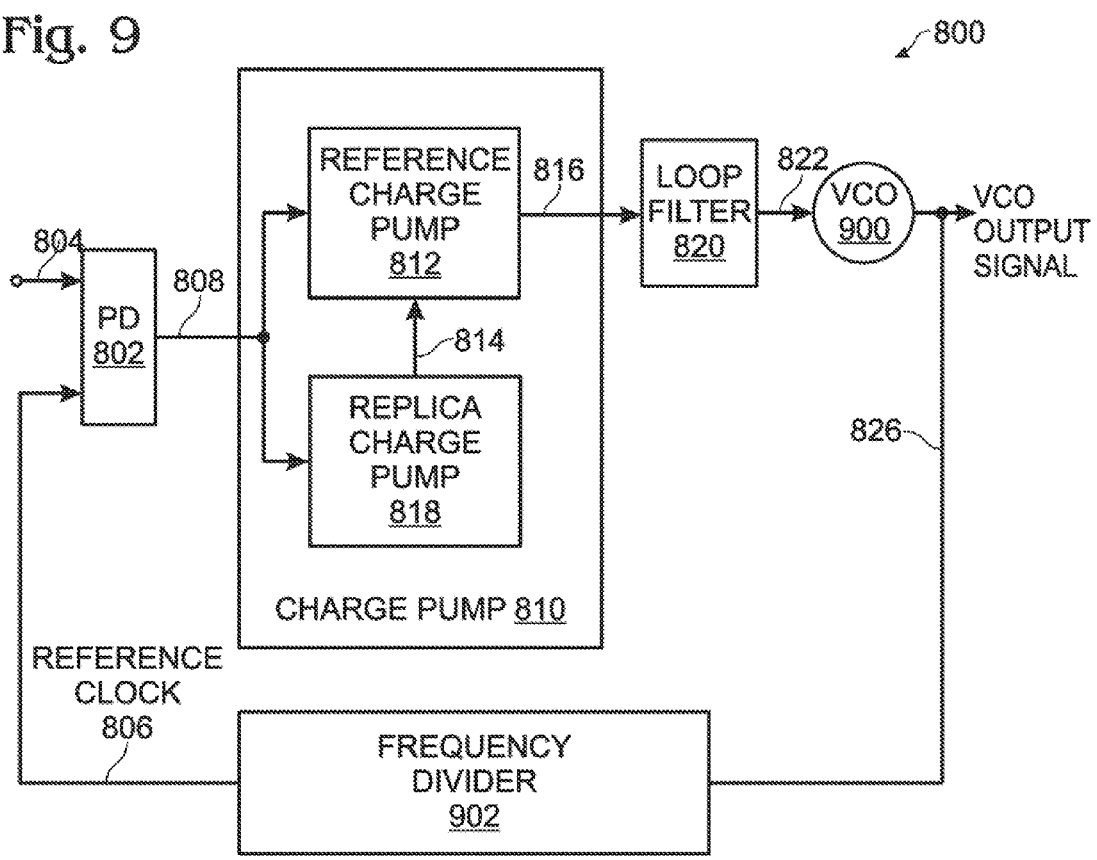
FIG. 9 is a schematic block diagram with the voltage controlled phase operator enabled as a voltage controlled oscillator (VCO).

FIG. 9 is a schematic block diagram with the voltage controlled phase operator enabled as a voltage controlled oscillator (VCO). The VCO 900 supplies a VCO output signal on line 826 responsive to the conditioned control voltage on line 822. The locked loop 800 further comprises a frequency divider 902 having an input on line 826 to accept the VCO output signal and a frequency divider output on line 806 to supply the reference clock.

Figure 10:
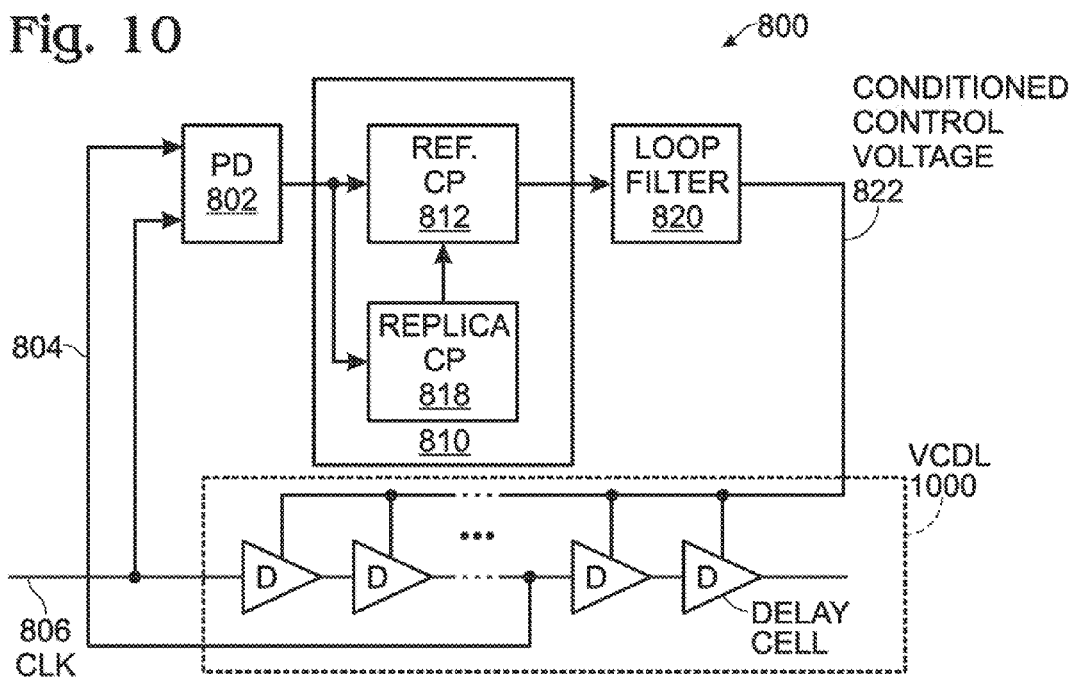
FIG. 10 is a schematic block diagram with the voltage controlled phase operator enabled as a voltage controlled delay line (VCDL).

FIG. 10 is a schematic block diagram with the voltage controlled phase operator enabled as a voltage controlled delay line (VCDL). The VCDL 1000 accepts a clock signal on line 806 and supplies the data signal on line 804. Alternately stated, the reference clock on line 806 is supplied with a delay responsive to the conditioned control voltage on line 822. The conditioned control voltage is applied to both the master and slave delay lines. The phase difference between PD inputs is 90 degrees.

Figure 11:
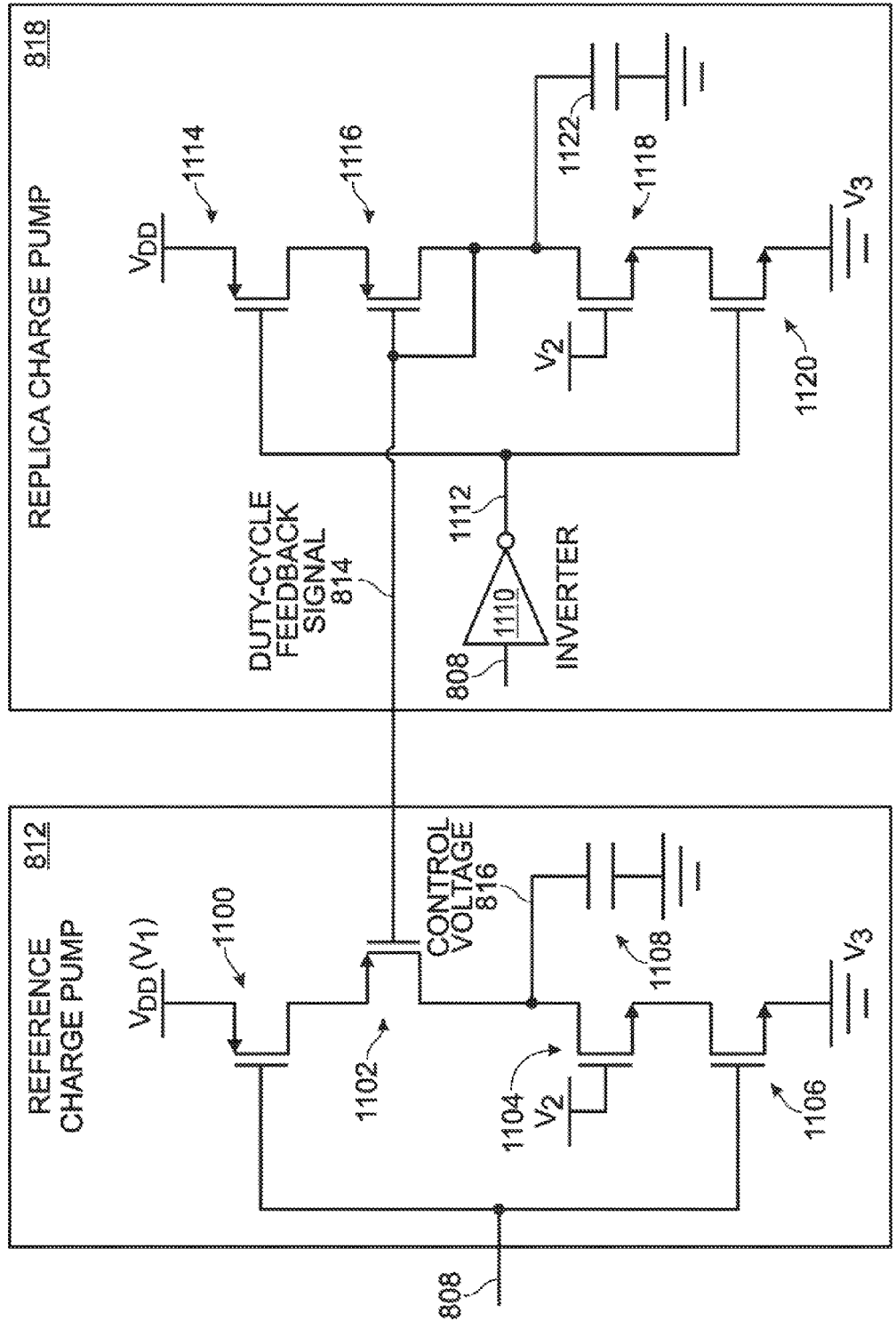
FIG. 11 is a schematic block diagram depicting in detail a first variation of the charge pump of FIGS. 8-10.

FIG. 11 is a schematic block diagram depicting in detail a first variation of the charge pump of FIGS. 8-10. The reference charge pump 812 includes a first p-channel metal-oxide semiconductor (PMOS) 1100 with a source connected to a first dc voltage (VDD) and a gate connected to accept the phase detector signal on line 808. A second PMOS 1102 has a source connected to a drain of the first PMOS 1100, a gate connected to accept the duty-cycle feedback signal on line 814, and a drain connected to supply the control voltage on line 816. A first n-channel MOS (NMOS) 1104 has a drain connected to supply the control voltage and a gate connected to a second dc voltage having a potential less than the first dc voltage. For example, the second voltage may be ground. A second NMOS 1106 has a drain connected to a source of the first NMOS 1104, a gate accepting the phase detector signal on line 808, and a source connected to a third dc voltage, less than or equal to the second dc voltage. As shown, the third voltage is ground. A first capacitor 1108 has a first terminal connected to the control voltage and a second terminal connected to a dc voltage. As shown, the second terminal is connected to ground.

The replica charge pump 818 includes an inverter 1110 having an input to accept the phase detector signal on line 808 and an output to supply an inverted phase, detector signal on line 1112. A third PMOS 1114 has a source connected to the first dc voltage and a gate connected to accept the inverted phase detector signal on line 1112. A fourth PMOS 1116 has a source connected to a drain of the third PMOS 1114, and a gate and a drain connected to the duty-cycle feedback signal on line 814. A third NMOS 1118 has a drain connected to supply the duty-cycle feedback signal and a gate connected to the second dc voltage. A fourth NMOS 1120 has a drain connected to a source of the third NMOS 1118, a gate connected to accept the inverted phase detector signal on line 1112, and a source connected to the third dc voltage. A second capacitor 1122 has a first terminal connected to the duty-cycle feedback signal on line 814 and a second terminal connected to a dc voltage. As shown, the second terminal is connected to ground.

Figure 12:
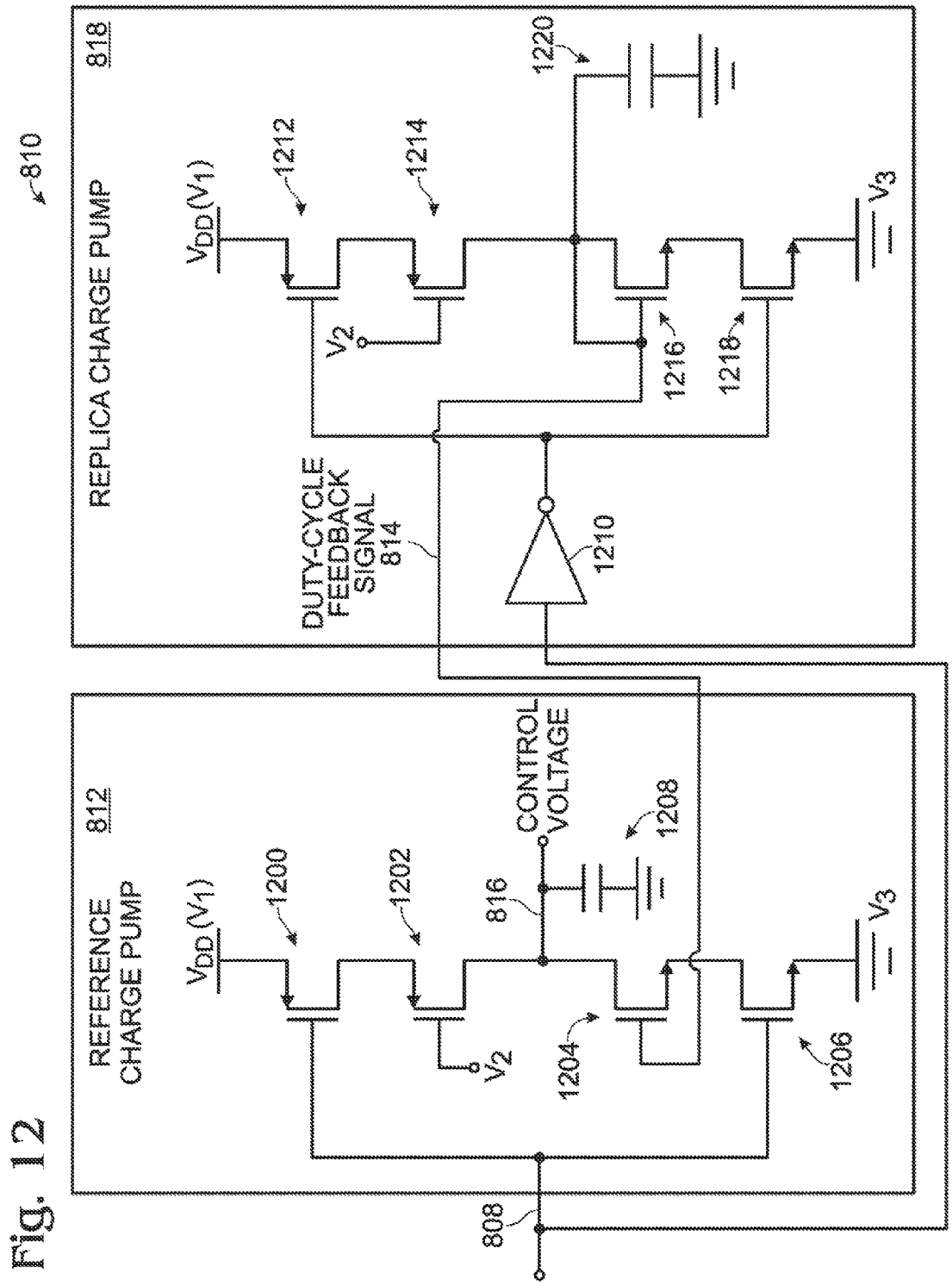
FIG. 12 is a schematic block diagram depicting in detail a second variation of the charge pump of FIGS. 8-10.

FIG. 12 is a schematic block diagram depicting in detail a second variation of the charge pump of FIGS. 8-10. The reference charge pump 812 includes a first PMOS 1200 with a source connected to a first dc voltage and a gate connected to accept the PD signal on line 808. A second PMOS 1202 has a source connected to a drain of the first PMOS 1200, a gate connected to a second dc voltage having a potential less than the first dc voltage, and a drain connected to supply the control voltage on line 816. A first NMOS 1204 has a drain connected to supply the control voltage and a gate connected to accept the duty-cycle feedback signal on line 814. A second NMOS 1206 has a drain connected to a source of the first NMOS 1204, a gate accepting the PD signal, and a source connected to a third dc voltage, having a potential less than or equal to the second dc voltage. A first capacitor 1208 has a first terminal connected to the control voltage and a second terminal connected to a dc voltage (e.g., ground).

The replica charge pump 818 includes an inverter 1210 having an input to accept the PD signal on line 808, and an output to supply the inverted PD signal. A third PMOS 1212 has a source connected to the first dc voltage and a gate connected to accept the inverted PD signal. A fourth PMOS 1214 has a source connected to a drain of the third PMOS 1212, and a gate connected to the second dc voltage, and a drain connected to the duty-cycle feedback signal online 814. A third NMOS 1216 has a gate and drain connected to the duty-cycle feedback signal. A fourth NMOS 1218 has a drain connected to a source of the third NMOS 1216, a gate connected to accept the inverted PD signal, and a source connected to the third dc voltage. A second capacitor 1220 has a first terminal connected to the duty-cycle feedback signal and a second terminal connected to a dc voltage.

Considering, either the charge pump of FIG. 9 or 10, the phase detector 802 supplies a square-wave phase detector signal on line 808 with a 50% duty cycle representing a condition where the phase of the data signal on line 804 is orthogonal in phase to the reference clock on line 806.

If the condition occurs that the first and second PMOS on-times currents are mismatched with respect to the first and second NMOS on-time currents (see FIG. 11 or 12), the current mismatch in the reference charge pump control voltage is corrected in response to the duty-cycle feedback signal.

Functional Description

Figure 13:
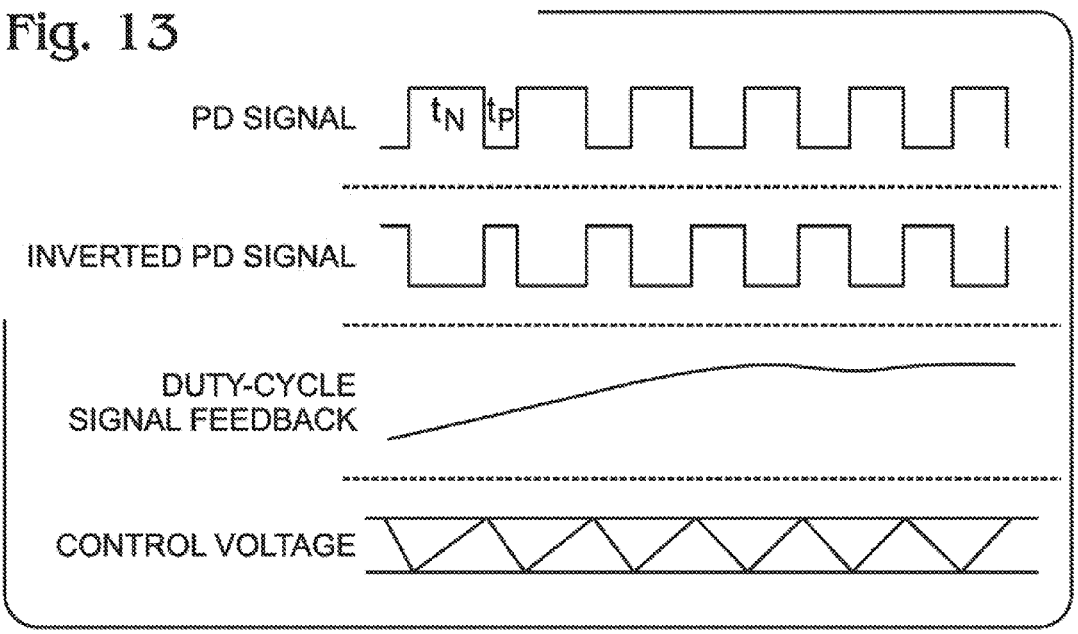
FIG. 13 depicts timing diagrams showing the control voltage of a charge pump similar to the one used in FIG. 8.

FIG. 13 depicts timing diagrams showing the control voltage of a charge pump similar to the one depicted in FIG. 8. An unbalanced (non-50%) duty cycle at the input to the charge pump causes steady state errors in the overall loop. Using the replica charge pump, the duty-cycle feedback signal quickly moves the source and sinking, currents to a matching condition, and the overall loop to a more balanced 50% duty cycle. Imbalance in the control voltage triggers the duty-cycle feedback and increases the duty-cycle feedback signal, which in turn decreases the $I_P$ current (driving or source current) to match the $I_N$ sinking current. At that point the bigger (overall) loop (PLL or DLL) changes the duty-cycle of PD signal to 50%, which results in a smaller steady-state error for the whole loop.

Ideally in a DLL or PLL, when locked and settled, the inputs of the phase detector are 90 degrees out of phase, which results in a 50% duty cycle square wave applied to the charge pump with equal source (Ip) and sink (In) currents. If a PVT variation occurs, Ip and In mismatch may result, leading to delay offset. If Ip>In, then the PD duty cycle >50%. As the control voltage increases, an increase in the duty-cycle feedback signals leads to a decrease in Ip, and the duty cycles returns to 50%. Alternately, if Ip<In, the PD duty cycles becomes <50%. As the control voltage decreases, a decrease in the duty-cycle feedback signal leads to an increase in Ip, and the duty cycle returns to 50%.

Figure 1:
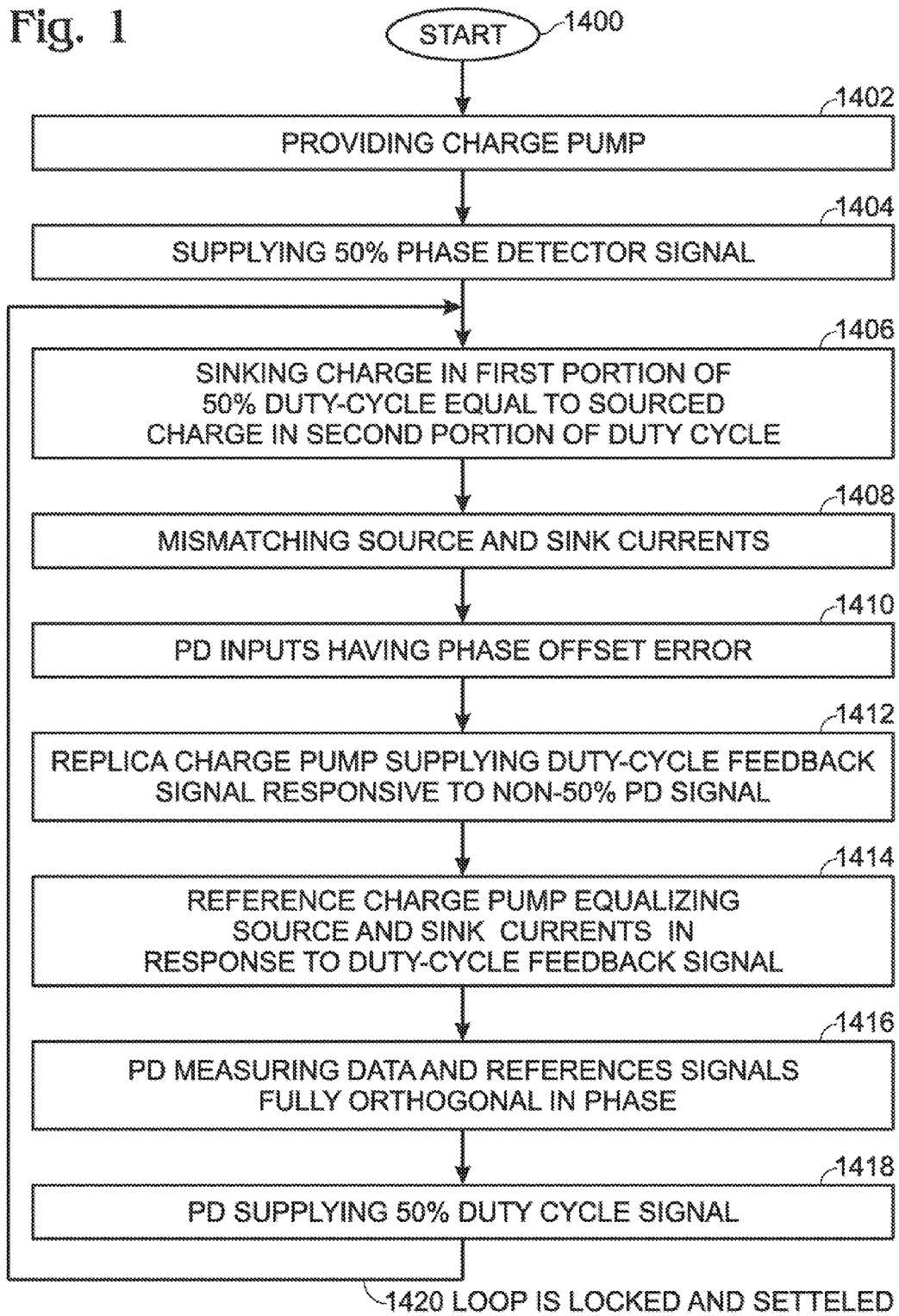
FIG. 1 is a flowchart illustrating a method for balancing current mismatches in a locked loop charge pump.
Figure 2:
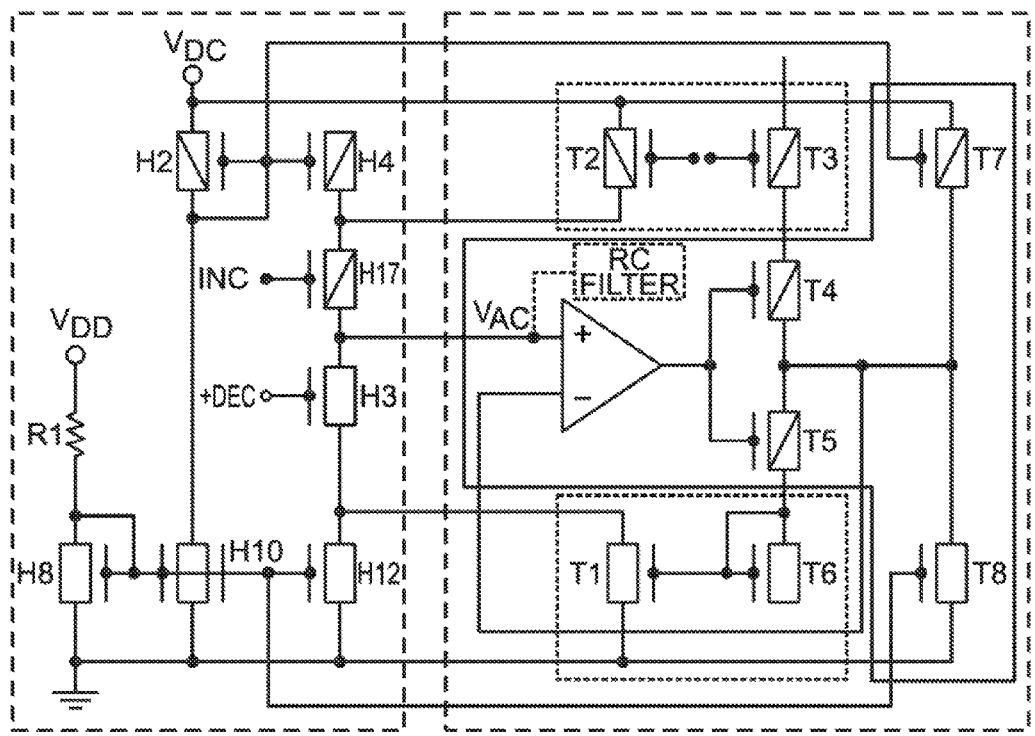
FIG. 2 is a schematic diagram of a charge pump, as presented by Gersbach et al., U.S. Pat. No. 5,508,660, entitled, Charge pump circuit with symmetrical current output for phase-controlled loop system (prior art).
Figure 3:
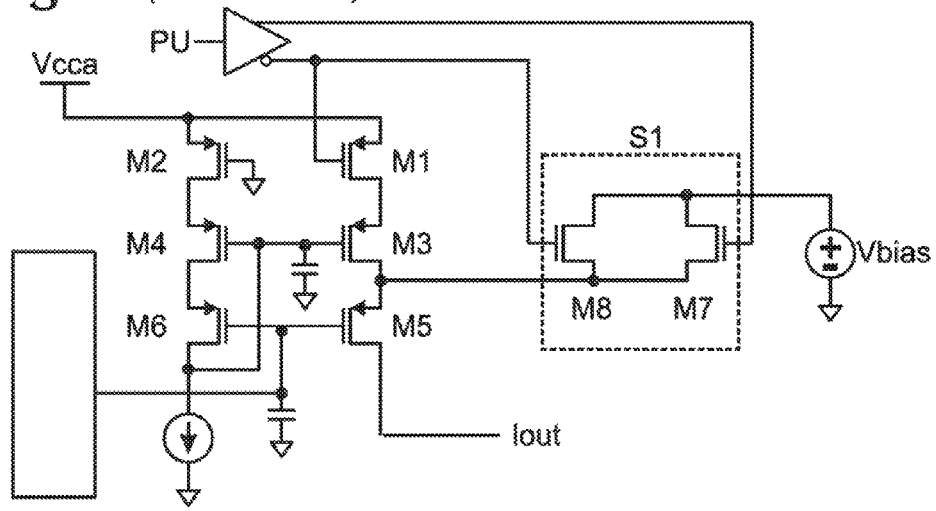
FIG. 3 is a schematic diagram of a charge pump as presented by Sudjian et al., U.S. Pat. No. 7,015,736, entitled, Symmetric Charge pump (prior art).
Figure 7A:
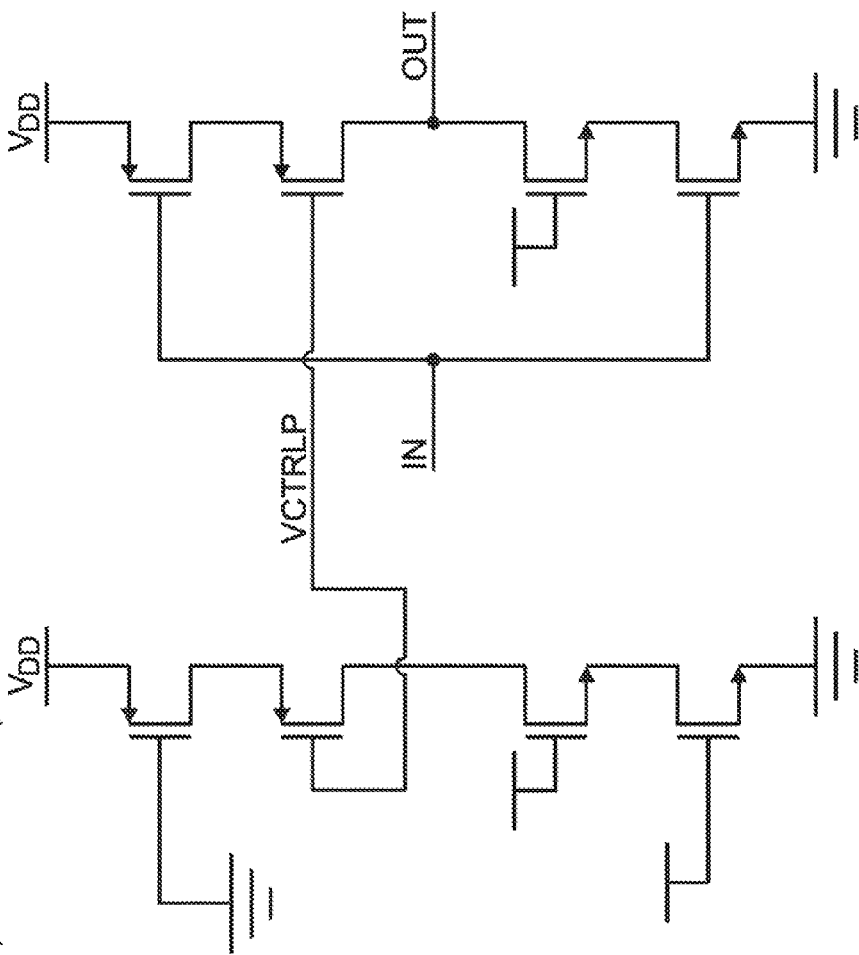
Figure 6:
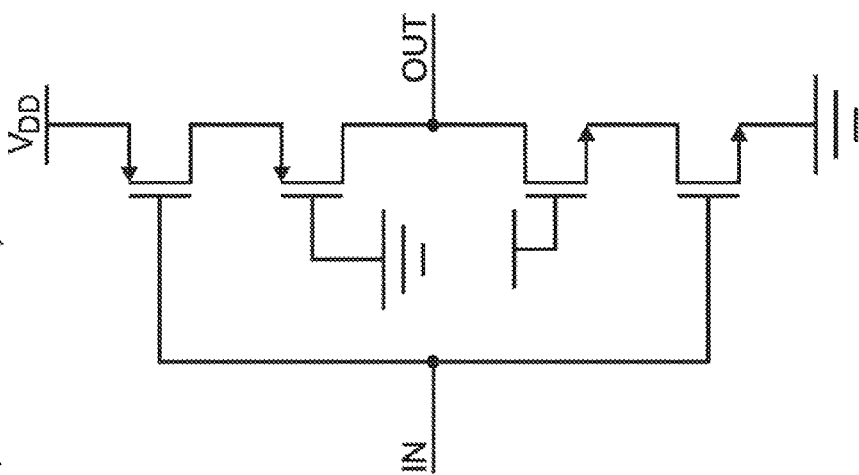
FIG. 6 is a schematic diagram of a charge pump with no current matching (prior art).

FIG. 1 is a flowchart illustrating a method for balancing current mismatches in a locked loop charge pump. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 1400.

Step 1402 provides a phase detector to accept a data signal having a first frequency and a reference clock having the first frequency, and to supply a phase detector signal. Step 1402 provides a charge pump including a reference charge pump having an input interface to accept the phase detector signal and a duty-cycle feedback signal, and to supply a control voltage. Also provided is a replica charge pump to accept the phase detector signal and to supply the duty-cycle feedback signal. A loop filter accepts the control voltage and has an output to supply a conditioned control voltage. A voltage controlled phase operator has an input to accept the conditioned control voltage and an output to supply a voltage controlled operator output signal.

In response to a phase of the data signal being orthogonal to a phase of the reference clock, in Step 1404 the phase detector supplies a square wave phase detector signal having a 50% duty cycle. In Step 1406 the charge pump sinks a first amount of charge during a first 50% portion of each control voltage duty cycle, equal to the first amount of charge sourced during a second 50% portion of each control voltage duty cycle. Details of the charge pump have been provided above in the explanations of FIGS. 11 and 12.

In one aspect, sinking the first amount of charge equal to the sourced amount of charge in Step 1406 includes:

$$Ip \times Tp = In \times Tn,$$

where In is the reference charge pump sink current;
Ip is the reference charge pump source current;
Tp is the time period when the reference charge pump NMOSs are turned off; and,
Tn is the time period when the reference charge pump NMOSs are turned on.

In loop lock is disturbed, in Step 1408 the reference charge pump source current (Ip) is mismatched with the sinking current (In), resulting in a non-equal Tn and Tp time periods. In response to the mismatched currents, the phase detector accepting reference and data signals in Step 1410 has a steady state phase offset error, and the PD supplies a non-50% duty cycle square wave phase detector signal. In Step 1412 the replica charge pump supplies a duty-cycle feedback signal to the reference charge pump responsive to the non-50% duty cycle phase detector signal. In Step 1414 the reference charge pump equalizes the source and sink currents in response to the duty-cycle feedback signal. In Step 1416 the phase detector measures reference and data signals fully orthogonal in phase, and in Step 1418 the phase detector supplies the square wave phase detector signal with the 50% duty cycle. At this point the loop is locked and settled, as represented by the arrow labeled 1420, and the method returns to Step 1406.

FIG. 5 is a flowchart illustrating a variation in the method for balancing current mismatches in a locked loop charge pump. The method starts at Step 500. Step 502 provides a reference charge pump and a replica charge pump enabled with duty cycle feedback. In Step 504 the phase detector generates a square wave with a duty cycle that changes proportionally to changes in the phase difference of its inputs. Step 506 determines if the overall (DLL or PLL) loop is settled. If yes, Step 508 determines if the phase detector (PD) output has a 50% duty cycle. In Step 510 the loop is locked and current mismatches have been corrected, and the method ends in Step 512. If the PD does not have a 50% duty cycle, Step 514 determines that the sourcing and sinking currents are mismatched. In Step 516 the PD's non-50% duty cycle is applied to the replica charge pump, generating duty-cycle feedback. In Step 518 the duty-cycle feedback signal changes the sourcing and sinking currents so that they match, and the method returns to Step 506.

A duty-cycle feedback charge pump device and method have been provided. Examples of particular devices and device connections have been presented to illustrate the invention. However, the invention is not limited to merely these examples. Other variations and embodiments of the invention will occur to those skilled in the art.

I claim:

1. A duty-cycle feedback charge pump comprising:
    a reference charge pump having an interface to accept an input signal, an interface to accept a duty-cycle feedback signal, and an interface to supply an output signal;
    a replica charge pump having an interface to accept the input signal and an interface to supply the duty-cycle feedback signal;
    wherein the reference charge pump includes:
        a first p-channel metal-oxide semiconductor (PMOS) with a source connected to a first dc voltage and a gate connected to accept the input signal;
        a second PMOS with a source connected to a drain of the first PMOS, a gate connected to accept the duty-cycle feedback signal, and a drain connected to supply the output signal;
        a first n-channel MOS (NMOS) having a drain connected to supply the output signal and a gate connected to a second dc voltage, having a potential less than the first dc voltage;
        a second NMOS having a drain connected to a source of the first NMOS, a gate accepting the input signal, and a source connected to a third dc voltage, having a potential less than or equal to the second dc voltage;
        a first capacitor having a first terminal connected to the output signal and a second terminal connected to a dc voltage;
    wherein the replica charge pump includes:
        an inverter having an input to accept the input signal, and an output to supply the inverted input signal;
        a third PMOS with a source connected to the first dc voltage and a gate connected to accept the inverted input signal;
        a fourth PMOS with a source connected to a drain of the third PMOS, and a gate and a drain connected to the duty-cycle feedback signal;
        a third NMOS having a drain connected to supply the duty-cycle feedback signal and a gate connected to the second dc voltage;
        a fourth NMOS having a drain connected to a source of the third NMOS, a gate connected to accept the inverted input signal, and a source connected to the third dc voltage; and,
        a second capacitor having a first terminal connected to the duty-cycle feedback signal and a second terminal connected to a dc voltage.

2. A locked loop with a duty-cycle feedback charge pump comprising:
    a phase detector having a first input to accept a data signal having a first frequency, a second input to accept a reference clock having the first frequency, and an output to supply a phase detector signal with a change in duty cycle proportional to a change in phase difference between the data signal and the reference clock;
    a charge pump including:
        a reference charge pump having an input interface to accept the phase detector signal, an interface to accept a duty-cycle feedback signal, and an interface to supply a control voltage; and,
        a replica charge pump having an interface to accept the phase detector signal and an interface to supply the duty-cycle feedback signal;
    a loop filter having an input to accept the control voltage and an output to supply a conditioned control voltage;
    a voltage controlled phase operator having an input to accept the conditioned control voltage and an output to supply a voltage controlled phase operator signal with a phase responsive to the conditioned control voltage;
    wherein the reference charge pump includes:
        a first p-channel metal-oxide semiconductor (PMOS) with a source connected to a first dc voltage and a gate connected to accept the phase detector signal;

a second PMOS with a source connected to a drain of the first PMOS, a gate connected to accept the duty-cycle feedback signal, and a drain connected to supply the control voltage;

a first n-channel MOS (NMOS) having a drain connected to supply the control voltage and a gate connected to a second dc voltage, having a potential less than, or equal to the first dc voltage;

a second NMOS having a drain connected to a source of the first NMOS, a gate accepting the phase detector signal, and a source connected to a third dc voltage, less than or equal to the second dc voltage;

a first capacitor having a first terminal connected to the control voltage and a second terminal connected to a dc voltage;

wherein the replica charge pump includes:
an inverter having an input to accept the phase detector signal, and an output to supply an inverted phase detector signal;

a third PMOS with a source connected to the first dc voltage and a gate connected to accept the inverted phase detector signal;

a fourth PMOS with a source connected to a drain of the third PMOS, and a gate and a drain connected to the duty-cycle feedback signal;

a third NMOS having a drain connected to supply the duty-cycle feedback signal and a gate connected to the second dc voltage;

a fourth NMOS having a drain connected to a source of the third NMOS, a gate connected to accept the inverted phase detector signal, and a source connected to the third dc voltage; and, a second capacitor having a first terminal connected to the duty-cycle feedback signal and a second terminal connected to a dc voltage.

3. The locked loop of claim 2 wherein the voltage controlled phase operator is a VCO supplying a VCO output signal responsive to the conditioned control voltage;

the locked loop further comprising:
a frequency divider having an input to accept the VCO output signal and a frequency divider output to supply the reference clock.

4. The locked loop of claim 2 wherein the voltage controlled phase operator is a voltage controlled delay line (VCDL) to supply the reference clock with a delay responsive to the conditioned control voltage.

5. The locked loop of claim 2 where the phase detector supplies a square-wave phase detector signal with a 50% duty cycle representing a condition where the phase of the data signal is orthogonal in phase to the reference clock.

6. The locked loop of claim 5 wherein the first and second PMOS on-times currents are mismatched with respect to the first and second NMOS on-time currents; and,
wherein the current mismatch in the reference charge pump control voltage is corrected in response to the duty-cycle feedback signal.

7. A duty-cycle feedback charge pump comprising:
a reference charge pump having an interface to accept an input signal, an interface to accept a duty-cycle feedback signal, and an interface to supply an output signal;

a replica charge pump having an interface to accept the input signal and an interface to supply the duty-cycle feedback signal;

wherein the reference charge pump includes:
a first PMOS with a source connected to a first dc voltage and a gate connected to accept the input signal;

a second PMOS with a source connected to a drain of the first PMOS, a gate connected to a second dc voltage having a potential less than, or equal to the first dc voltage, and a drain connected to supply the output signal;

a first NMOS having a drain connected to supply the output signal and a gate connected to accept the duty-cycle feedback signal;

a second NMOS having a drain connected to a source of the first NMOS, a gate accepting the input signal, and a source connected to a third dc voltage, having a potential less than or equal to the second dc voltage;

a first capacitor having a first terminal connected to the output signal and a second terminal connected to a dc voltage;

wherein the replica charge pump includes:
an inverter having an input to accept the input signal, and an output to supply the inverted input signal;

a third PMOS with a source connected to the first dc voltage and a gate connected to accept the inverted input signal;

a fourth PMOS with a source connected to a drain of the third PMOS, and a gate connected to the second dc voltage, and a drain connected to the duty-cycle feedback signal;

a third NMOS having a gate and drain connected to the duty-cycle feedback signal;

a fourth NMOS having a drain connected to a source of the third NMOS, a gate connected to accept the inverted input signal, and a source connected to the third dc voltage; and, a second capacitor having a first terminal connected to the duty-cycle feedback signal and a second terminal connected to a dc voltage.

\* \* \* \* \*